PROCESS FOR MAKING PHOTOSENSITIVE SEMICONDUCTOR DEVICES

Filed June 22, 1964 4 Sheets-Sheet 1

INVENTORS
PETER ALBERT ILES
RAFAEL ORLANDO VICTORIA
BY Lyon & Lyon
ATTORNEYS

PROCESS FOR MAKING PHOTOSENSITIVE SEMICONDUCTOR DEVICES

INVENTORS
PETER ALBERT ILES
RAFAEL ORLANDO VICTORIA
BY Lyon & Lyon
ATTORNEYS

Sept. 17, 1968 P. A. ILES ET AL 3,401,448

PROCESS FOR MAKING PHOTOSENSITIVE SEMICONDUCTOR DEVICES

Filed June 22, 1964 4 Sheets-Sheet 3

INVENTORS
PETER ALBERT ILES
RAFAEL ORLANDO VICTORIA
BY
Lyon & Lyon
ATTORNEYS

Sept. 17, 1968 P. A. ILES ET AL 3,401,448

PROCESS FOR MAKING PHOTOSENSITIVE SEMICONDUCTOR DEVICES

Filed June 22, 1964 4 Sheets-Sheet 4

INVENTORS
PETER ALBERT ILES
RAFAEL ORLANDO VICTORIA
BY Lyon & Lyon
ATTORNEYS

United States Patent Office 3,401,448
Patented Sept. 17, 1968

3,401,448
PROCESS FOR MAKING PHOTOSENSITIVE SEMICONDUCTOR DEVICES

Peter Albert Iles, Arcadia, and Rafael Orlando Victoria, Los Angeles, Calif., assignors, by mesne assignments, to Globe-Union Inc., Milwaukee, Wis., a corporation of Delaware Filed June 22, 1964, Ser. No. 377,013
5 Claims. (Cl. 29—572)

This invention relates to an array of uniform photosensitive semiconductor devices and a process for making the same.

There is an extensive market for photosensitive devices acceptable for use in systems designed to read out information stored on punched cards or tapes, in complicated matrices designed for data processing systems, and in other applications where system requirements call for a plurality of photosensitive devices having uniform characteristics. Various attempts have been made to satisfy this market with semiconductor devices, but to the present these have required that the devices be made individually with the consequent difficulty of handling and achieving uniform characteristics, or else have been made in batches in such a manner as to require often damaging etching or cutting to isolate the individual devices.

According to the present invention, a process is provided for forming a plurality of photosensitive semiconductor devices which do not require heavy etching or cutting to isolate individual devices. The process results in improved uniformity, as area, sensitivity and operating characteristics of the devices may be closely controlled. The process is ideal for initially forming an array of the devices in a wide range of configurations, and thus does not require any later assemblage or arrangement into a desired pattern. The contacts of the devices may be formed on the sides thereof, thereby permitting flush mounting of collimators, covers, or the like, which heretofore has not been possible.

It is therefore an object of the present invention to provide a process of forming an array of photosensitive semiconductor devices.

It is also an object of the present invention to provide such a process wherein various masking techniques are utilized to control the formation of the devices.

It is another object of the present invention to provide an improved array of photosensitive semiconductor devices.

It is a further object of the present invention to provide such an array in which each of the individual devices is electrically isolated from the remaining devices but in which all the devices have substantially uniform areas and operating characteristics.

These and other objects and advantages of the present invention will become more apparent upon reference to the accompanying description and drawings in which.

Figures 1, 2, 3, 3A, 4, 4A, 5, 5A, 6, 6A:
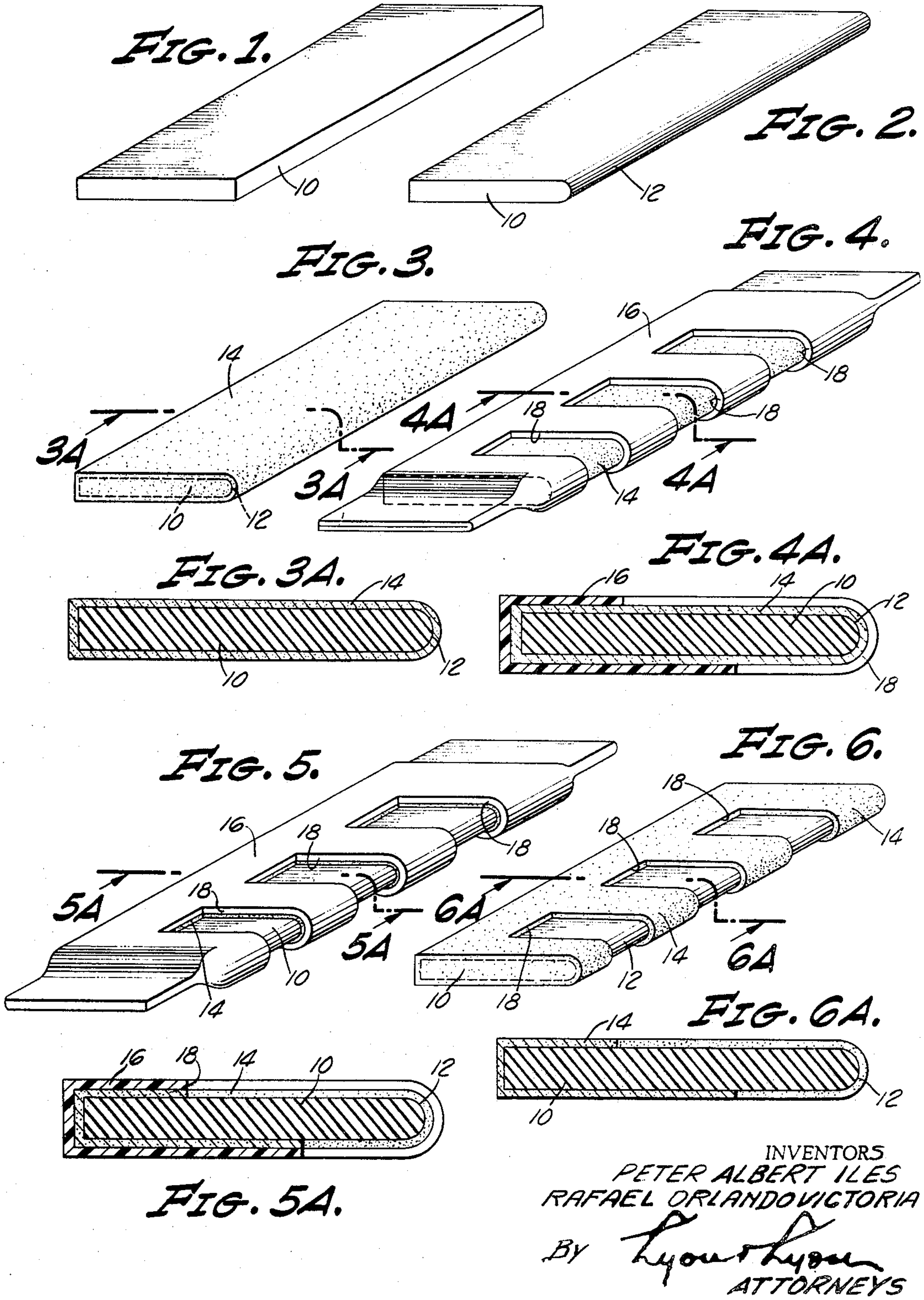
FIGURES 1 through 12B illustrate the various steps in constructing an array of semiconductor devices according to the process of the present invention.

The process of forming the array of photosensitive semiconductor devices according to the present invention will now be described, reference being had to FIGURES 1 through 16. A silicon blank 10, illustrated in FIGURE 1, is cut to the desired size and the surfaces are lapped to remove saw damage. As shown in FIGURE 2, one edge 12 of the wafer is rounded and the wafer etched to remove work damage, for example, by immersing it in a 1:6:10 solution of hydrofluoric acid: nitric acid: acetic acid for 2 to 5 minutes. The wafer 10 is then placed in a furnace and exposed to an atmosphere of tetraethylorthosilicate until a thick (greater than one micron) layer of silicon dioxide 14 is formed on the surface of the wafer. This layer is shown in FIGURES 3 and 3A.

The wafer 10 is then covered with a suitable mask 16, the mask having a plurality of openings 18 which leave uncovered the portions of the semiconductor which are to be active. As shown in FIGURES 4 and 4A, each of the openings 18 expose a portion of the top of the wafer 10, the rounded edge 12, and a small area on the underside of the wafer. Although any easy to apply and remove masking material may be used, a polyethylene terephthalate tape has been found ideal for use in the present invention. After the mask has been applied to the oxidized wafer, the wafer is dipped into an acid capable of removing silicon dioxide from the exposed areas. For example, this dipping may be done in hydrofluoric acid for one minute at 20° C. This treatment results in the exposure of bare silicon under the openings 18 in the mask 16, as shown in FIGURES 5 and 5A. The mask is then removed (FIGURES 6 and 6A).

Figures 7, 7A, 8, 8A:
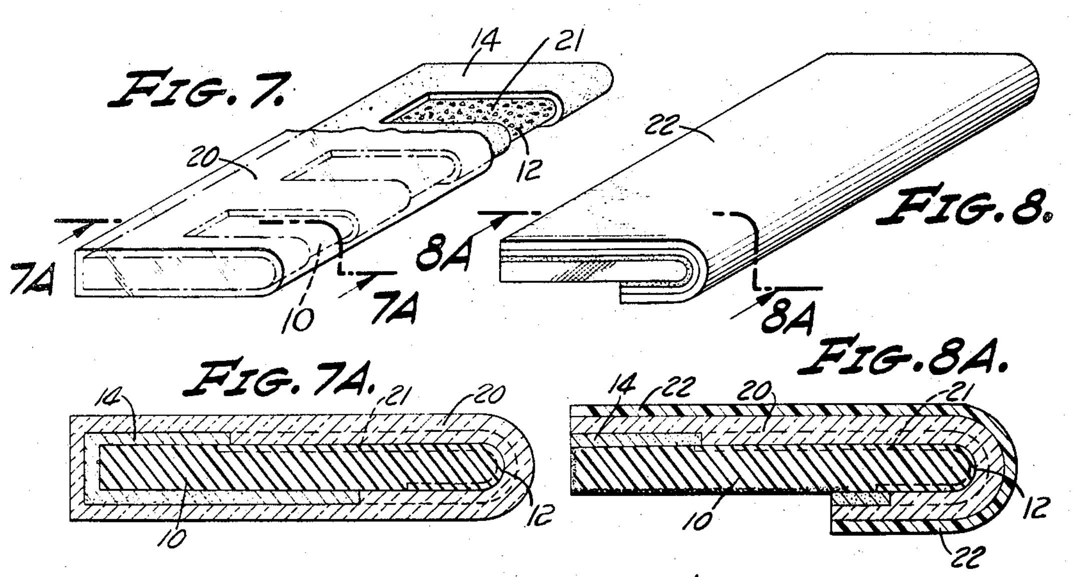

The wafer is now placed in a diffusion furnace and an impurity of the opposite conductivity type to that of the silicon itself is diffused into the areas not covered by silicon dioxide to form P-N junctions therein, the silicon dioxide forming an impermeable mask against the impurity. The resultant structure, partly broken away, is shown in FIGURES 7 and 7A. If the wafer 10 is P-type silicon, a typical diffusion is accomplished by flowing $P_2O_5$ and $O_2$ gases over the silicon at a temperature of about 875° C. for 30 minutes, followed by slow cooling in $O_2$ down to 600° C. As a result of this cycle, a coating of phosphorosilicate glass 20 is formed on the surface of the wafer and P-N junctions 21 are formed below the surfaces of the exposed area. Other donor impurities could be used in place of phosphorous if desired—the diffusion conditions for each of them being well known in the art. If the silicon was N-type, diffusion can be accomplished by using $B_2O_3$ or $BCl_3$. The diffusion conditions for boron, as well as for other acceptor impurities which may also be used, are also available in the literature.

Figures 9, 10, 11, 12, 12A, 12B:
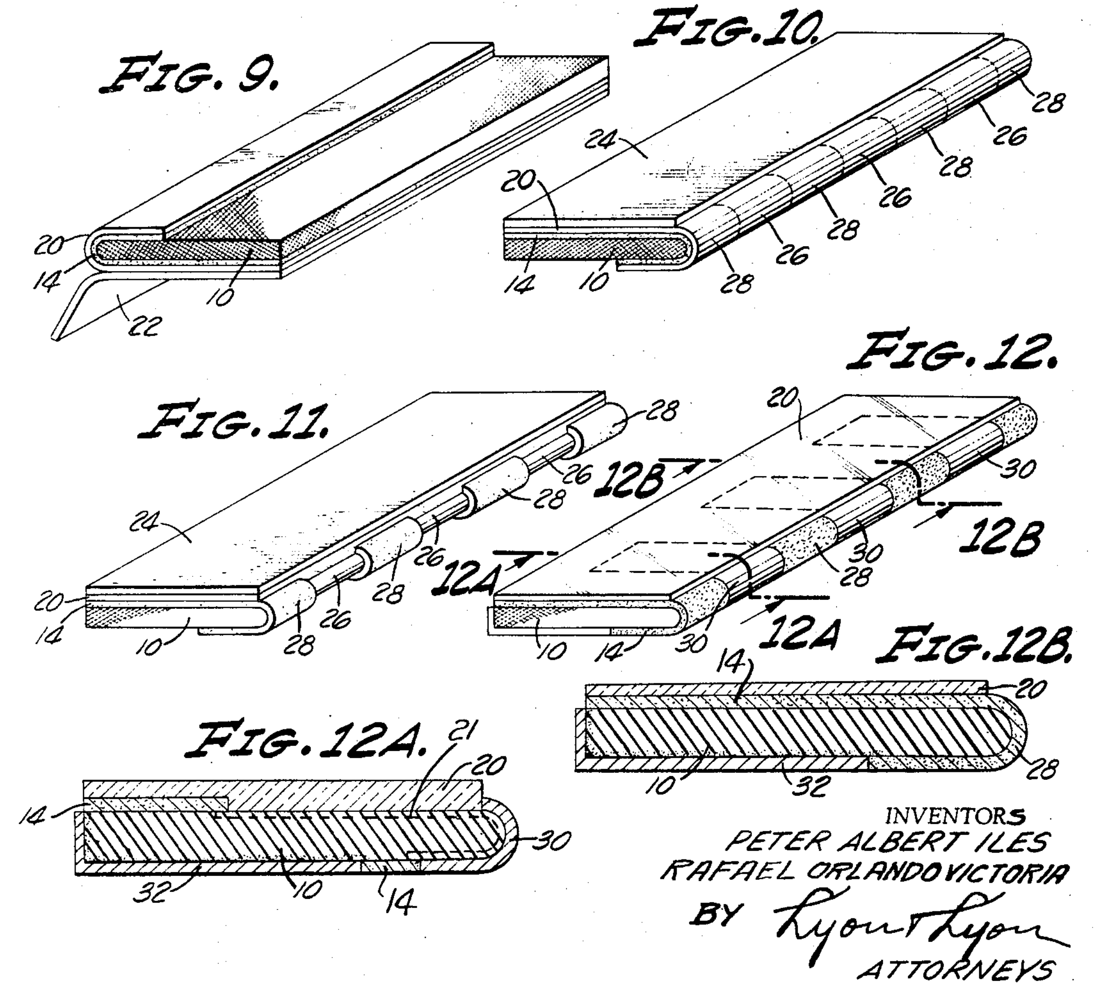

The active areas are now carefully protected by a mask 22, as shown in FIGURES 8 and 8*a*, which may, for example, be the same polyethylene terephthalate tape, and the remaining back surface is then sandblasted to remove the diffusion layer and the silicon dioxide so as to expose the bulk silicon. The mask 22 is then removed (FIGURE 9) and the wafer cleaned. As shown in FIGURE 10, the top of the wafer is now masked with a mask 24. No additional masking is necessary to cover the regions 28 between the contact areas 26 at this time.

The wafer is now heated and cooled, and quickly dipped in a suitable acid, for example hydrofluoric acid, for a time sufficient to remove the phosphorosilicate glass from the regions 26 therebetween, but not long enough to remove the silicon dioxide layer from the regions 28. Contacts 30 are then applied to the areas 26 by any suitable technique. Electroless nickel plating has proved successful for this purpose. The sandblasted bottom face of the wafer is plated with a contact area 32 at the same time. The silicon dioxide layer prevents plating wherever it is present. The mask 24 is then removed. The slice is then cleaned and dipped into molten solder, the plated areas only becoming soldered. The finished semiconductor array is shown in FIGURES 12, 12A and 12B. The glass layer 20 on the top surface of the wafer is left on the wafer and serves as a low reflectivity coating.

Figure 13:
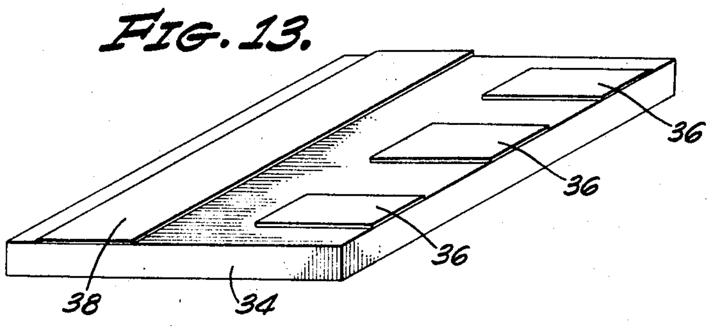
FIGURES 13, 14, 14A, 15 and 15A illustrate the mounting of the array.
Figure 14:
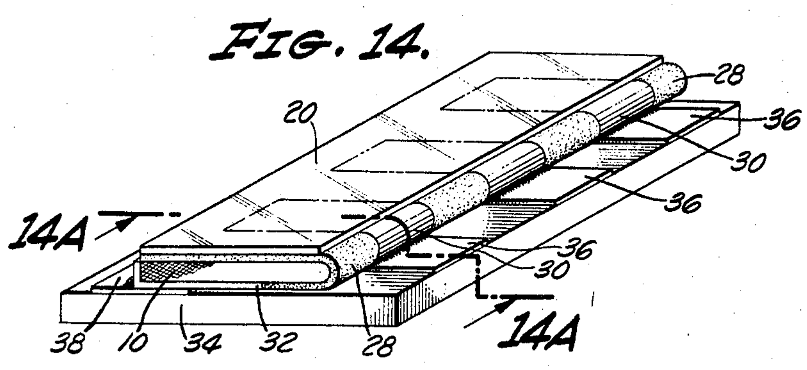
Figure 14A:
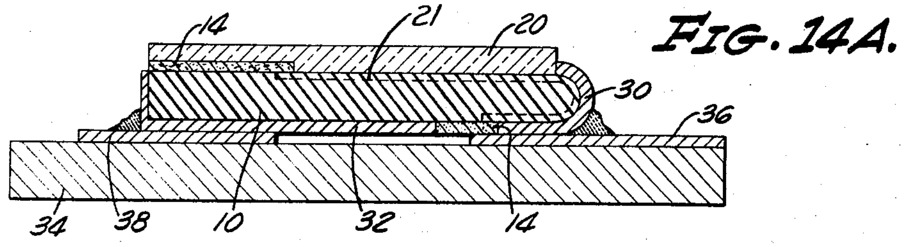

The wafer with its array of semiconductor devices is now ready for mounting. A mounting board suitable for mounting the wafer is shown in FIGURE 13. This mounting board is provided with an insulating base 34 on which are positioned copper areas 36 corresponding to the contacts of the wafer and a copper strip 38 suitable for making contact with the bottom contact area of the wafer. The mounting board may be prepared by covering a single sided copper clad board with a mask similar to that used for masking the wafer and then covering the mask with wax or masking ink. A center strip is also masked. The wax or ink is then set and the mask removed. The copper is then etched away leaving the contact pattern shown. The contact strip 38 is then soldered and the wafer placed with its contacts engaging the areas 36 and its bottom electrode engaging the strip 38. The contacts and back electrode are then soldered to the copper areas of the mounting board, as shown in FIGURES 14 and 14A.

Figure 15:
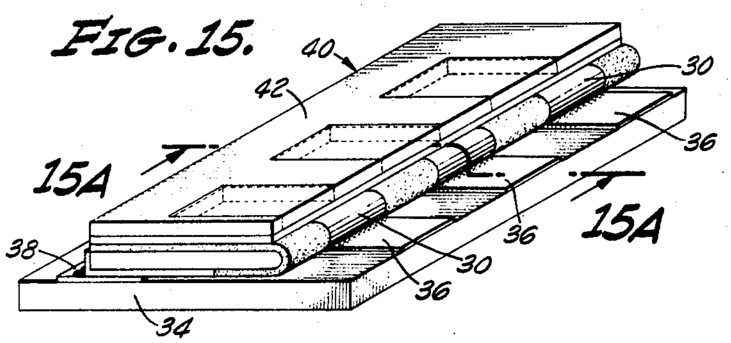
Figure 15A:
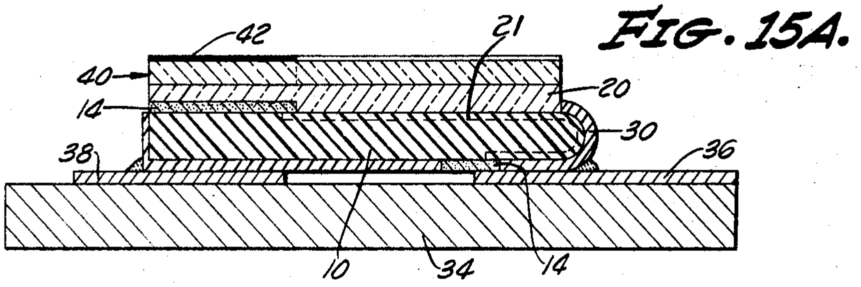

If desired, a collimator may now be mounted over the wafer, as shown in FIGURES 15 and 15A. The collimator 40 is preferably made by taking a glass plate covered with a photosensitive emulsion and laying a black paper mask cut in the same pattern as the mask used for the silicon wafer and the mounting board. The plate is then exposed and developed to make a negative. This negative is then placed over another photographic plate, exposed and developed to form an opaque portion 42. The resulting plate combines the function of a matching collimator for the device and a protective cover. Suitable leads are now attached to the contact areas of the mounting board and the array of photosensitive devices is ready for use.

Figure 16:
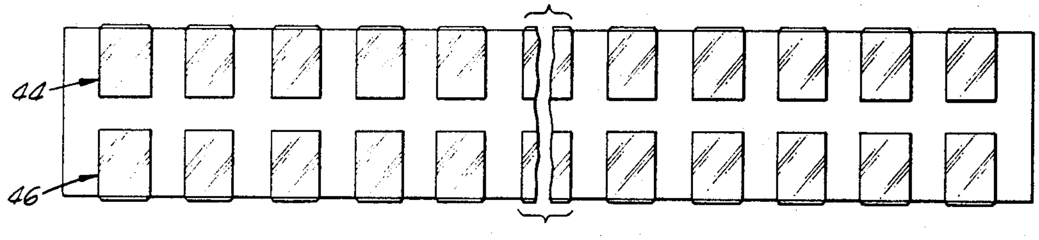
FIGURE 16 is a schematic illustration of a modification of the array of semiconductor devices made in accordance with the process of the present invention.

FIGURE 16 shows schematically another form that the array may take. In this embodiment, the array has been provided with two rows 44 and 46 of isolated photosensitive devices for use with punched cards or tapes having two rows of holes. It should be obvious that other configurations are equally possible using the process of the present invention. The invention thus may be embodied in other specific forms not departing from the spirit or central characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:

1. A process of forming an array of semiconductor devices, comprising:
- forming a protective non-conducting coating on the surface of a wafer-like body of silicon of a first conductivity type;
- masking the entire surface of said coated body except for a plurality of separated areas, each of said areas lying on the top of said body and extending down one edge thereof;
- removing the coating from the unmasked areas to expose the silicon;
- removing the mask;
  - exposing said body to impurities of the opposite conductivity type whereby said impurities are diffused into said exposed areas of said body to form P-N junctions therein, and a layer of silicate glass is formed on said body;
- masking substantially the entire top of the body;
- removing the glass layer from the portions of said areas extending down the edge of said body to expose the diffused silicon thereunder; and
- depositing a contact material on the areas of exposed silicon.

2. A process of forming an array of photosensitive semiconductor devices having substantially uniform characteristics, comprising:
- rounding one edge of a wafer-like body of silicon of a first conductivity type;
- forming an oxide coating on the surface of said silicon body;
- masking the entire surface of said coated body except for a plurality of isolated areas, each of said areas lying on the top of said body and extending down said rounded edge;
- etching away the oxide coating from the unmasked areas to expose the silicon thereunder;
- removing the mask;
- exposing said body to impurities of the opposite conductivity type at an elevated temperature whereby said impurities are diffused into said exposed areas of said body to form P-N junctions therein, and a layer of silicate glass is formed on said body;
- removing said glass layer and said oxide coating from the major portion of the bottom of said to expose the silicon thereunder;
- masking substantially the entire top of the body;
- removing the glass layer from the rounded edge of said body;
- removing said mask; and
- depositing a contact material on the areas of exposed silicon on the bottom and rounded edge of said body.

3. The process of claim 2 in which said body is then positioned on an insulating base having contact areas corresponding to its contact areas and the corresponding contact areas are then soldered together.

4. The process of claim 2 wherein said silicon is P-type and said impurity is phosphorous.

5. The process of claim 2 wherein said silicon is N-type and said impurity is boron.

References Cited

UNITED STATES PATENTS

| | | |
|---|---|---|
| 2,794,846 | 6/1957 | Fuller. |
| 2,981,877 | 4/1961 | Noyce. |

WILLIAM I. BROOKS, *Primary Examiner.*